(12) United States Patent
Hino

(10) Patent No.: US 9,728,831 B2
(45) Date of Patent: Aug. 8, 2017

(54) NON-RECIPROCAL CIRCUIT ELEMENT

(71) Applicant: Murata Manufacturing Co., Ltd., Kyoto (JP)

(72) Inventor: Seigo Hino, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/219,680

(22) Filed: Jul. 26, 2016

(65) Prior Publication Data
US 2016/0336634 A1    Nov. 17, 2016

Related U.S. Application Data

(63) Continuation of application No. PCT/JP2015/050887, filed on Jan. 15, 2015.

(30) Foreign Application Priority Data

Jan. 27, 2014    (JP) .................. 2014-012254

(51) Int. Cl.
| | |
|---|---|
| *H01P 1/36* | (2006.01) |
| *H01P 1/383* | (2006.01) |
| *H01P 1/387* | (2006.01) |
| *H03H 7/52* | (2006.01) |
| *H03H 7/01* | (2006.01) |

(Continued)

(52) U.S. Cl.
CPC ............... *H01P 1/36* (2013.01); *H01P 1/383* (2013.01); *H01P 1/387* (2013.01); *H03H 7/0115* (2013.01); *H03H 7/18* (2013.01); *H03H 7/52* (2013.01); *H05K 1/182* (2013.01)

(58) Field of Classification Search
CPC ............... H01P 1/36; H01P 1/38; H01P 1/383

USPC .................................. 333/1.1, 24.2
See application file for complete search history.

(56) References Cited

U.S. PATENT DOCUMENTS

| | | |
|---|---|---|
| 2011/0204989 A1 | 8/2011 | Wada |
| 2012/0019332 A1 | 1/2012 | Hino et al. |

FOREIGN PATENT DOCUMENTS

| | | |
|---|---|---|
| JP | 2001-237613 A | 8/2001 |
| JP | 4155342 B1 | 7/2008 |
| JP | 2009-302742 A | 12/2009 |

(Continued)

OTHER PUBLICATIONS

International Search Report issued in Japanese Patent Application No. PCT/JP2015/050887 dated Mar. 3, 2015.

(Continued)

*Primary Examiner* — Stephen E Jones
(74) *Attorney, Agent, or Firm* — Pearne & Gordon LLP

(57) ABSTRACT

Favorable isolation characteristics are obtained over a wide band in a non-reciprocal circuit element. A non-reciprocal circuit element includes: a magnetic material 10 to which a DC magnetic field is applied by a permanent magnet; and a plurality of center electrodes disposed on the magnetic material 10 so as to intersect each other in an insulated state. Of the plurality of center electrodes, a first center electrode 21 is connected at one end thereof to a first input/output port P1, and a second center electrode 22 is connected at one end thereof to a second input/output port P2. A resistance element R is connected in series between the ports P1 and P2, and a phase-shift circuit (a parallel resonant circuit composed of an inductance element L5 and a capacitance element C5) is connected in series with the resistance element R.

8 Claims, 8 Drawing Sheets

(51) Int. Cl.
*H03H 7/18* (2006.01)
*H05K 1/18* (2006.01)

(56) References Cited

FOREIGN PATENT DOCUMENTS

| | | |
|---|---|---|
| JP | 2011-176668 A | 9/2011 |
| JP | 2012-028356 A | 2/2012 |
| JP | 2012-028856 A | 2/2012 |

OTHER PUBLICATIONS

Written Opinion issued in Japanese Patent Application No. PCT/JP2015/050887 dated Mar. 3, 2015.

RELATED ART EXAMPLE

NON-RECIPROCAL CIRCUIT ELEMENT

This is a continuation of International Application No. PCT/JP2015/050887 filed on Jan. 15, 2015 which claims priority from Japanese Patent Application No. 2014-012254 filed on Jan. 27, 2014. The contents of these applications are incorporated herein by reference in their entireties.

BACKGROUND OF THE DISCLOSURE

Field of the Disclosure

The present disclosure relates to a non-reciprocal circuit element, and particularly relates to a non-reciprocal circuit element such as an isolator or a circulator used in the microwave bands.

Description of the Related Art

Hitherto, a non-reciprocal circuit element such as an isolator or a circulator has characteristics of transmitting signals only in a predetermined specific direction and not transmitting signals in the opposite direction. By utilizing the characteristics, for example, the isolator is used in a transmitting circuit unit of a mobile communication apparatus such as a cellular phone.

As such a type of non-reciprocal circuit element, Patent Document 1 discloses a non-reciprocal circuit element in which two center electrodes 21 and 22 (inductance elements L1 and L2) formed on a ferrite 10 and capacitors C1 and C2 form two LC parallel resonant circuits, and a resistance element R is connected in series between ends of the respective center electrodes 21 and 22, as shown in FIG. 11.

In the non-reciprocal circuit element disclosed in Patent Document 1, when a high-frequency signal is inputted to an input terminal IN (a forward direction), ports P1 and P2 are in-phase, and no current flows through the resistance element R, so that insertion loss decreases. Meanwhile, when a high-frequency current is inputted to an output terminal OUT (a reverse direction), a phase difference occurs between the potentials at the ports P1 and P2, and a current flows through the resistance element R, so that the high-frequency current is greatly attenuated (isolation characteristics are obtained).

However, since a frequency region of a high-frequency signal where the phase difference between the potentials at the ports P1 and P2 is great is limited, it is difficult to obtain preferable isolation characteristics over a wide band.

In addition, Patent Document 2 indicates that the band in which isolation characteristics are obtained is widened by connecting an LC series resonant circuit to a resistance element. In the technique disclosed in Patent Document 2, the band in which isolation characteristics are obtained is widened by matching a resistance element over a wide range on the basis of the resonance characteristics of the LC series resonant circuit.

Patent Document 1: Japanese Unexamined Patent Application Publication No. 2001-237613

Patent Document 2: Japanese Patent No. 4155342

BRIEF SUMMARY OF THE DISCLOSURE

An object of the present disclosure is to provide a non-reciprocal circuit element that is able to obtain favorable isolation characteristics over a wide band.

A non-reciprocal circuit element according to a first aspect of the present disclosure includes:

a magnetic material to which a DC magnetic field is applied by a permanent magnet; and a plurality of center electrodes disposed on the magnetic material so as to intersect each other in an insulated state, wherein of the plurality of center electrodes, a first center electrode is connected at one end thereof to a first input/output port, and a second center electrode is connected at one end thereof to a second input/output port, and a resistance element is connected in series between the first input/output port and the second input/output port, and a phase-shift circuit is connected in series with the resistance element.

A non-reciprocal circuit element according to a second aspect of the present disclosure includes:

a magnetic material to which a DC magnetic field is applied by a permanent magnet; and a first center electrode, a second center electrode, and a third center electrode disposed on the magnetic material so as to intersect each other in an insulated state, wherein the first center electrode is connected at one end thereof to a first input/output port and connected at another end thereof to ground, the second center electrode is connected at one end thereof to a second input/output port and connected at another end thereof to the ground, the third center electrode is connected at one end thereof to a third input/output port and connected at another end thereof to the ground, capacitance elements are connected in parallel with the first center electrode, the second center electrode, and the third center electrode, respectively, to form a first LC parallel resonant circuit, a second LC parallel resonant circuit, and a third LC parallel resonant circuit, and a resistance element is connected in series between the first input/output port and the second input/output port, and a phase-shift circuit is connected in series with the resistance element.

A non-reciprocal circuit element according to a third aspect of the present disclosure includes:

a magnetic material to which a DC magnetic field is applied by a permanent magnet; and a first center electrode and a second center electrode disposed on the magnetic material so as to intersect each other in an insulated state, wherein the first center electrode is connected at one end thereof to a first input/output port and connected at another end thereof to ground, the second center electrode is connected at one end thereof to a second input/output port and connected at another end thereof to the ground, capacitance elements are connected in parallel with the first center electrode and the second center electrode, respectively, to form a first LC parallel resonant circuit and a second LC parallel resonant circuit, and a resistance element is connected in series between the first input/output port and the second input/output port, and a phase-shift circuit is connected in series with the resistance element.

In the non-reciprocal circuit element, when a high-frequency signal is inputted in a reverse direction, a phase difference occurs between the potentials at the first input/output port and the second input/output port, and a current flows through the resistance element, so that the high-frequency signal is greatly attenuated. Since the phase-shift circuit is connected in series with the resistance element, the phase difference becomes great over a wide band, and the isolation characteristics are improved over a wide band.

According to the present disclosure, it is possible to obtain favorable isolation characteristics over a wide band.

DETAILED DESCRIPTION OF THE DISCLOSURE

Figure 1:
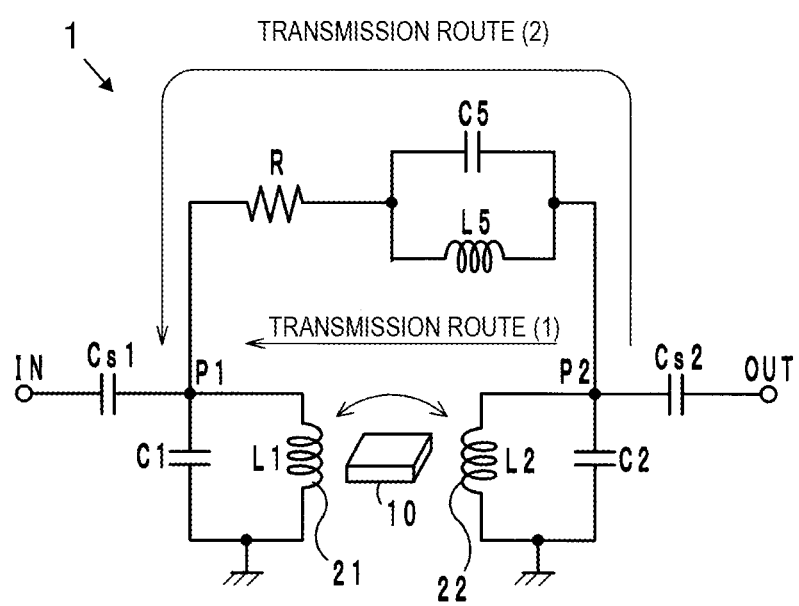
FIG. 1 is an equivalent circuit diagram of a non-reciprocal circuit element according to a first embodiment.

Hereinafter, embodiments of the non-reciprocal circuit element according to the present disclosure will be described with reference to the accompanying drawings. In the respective drawings, the same elements and portions are designated by like reference numerals, and the overlap description is omitted.

First Embodiment; See FIGS. 1 to 6

A non-reciprocal circuit element according to a first embodiment is configured with an equivalent circuit shown in FIG. 1. That is, the non-reciprocal circuit element includes: a pair of permanent magnets 31 (see FIGS. 2 and 3); a magnetic material 10 (hereinafter, referred to as ferrite) to which a DC magnetic field is applied by the permanent magnets 31; and a first center electrode 21 and a second center electrode 22 disposed on the ferrite 10 so as to intersect each other in an insulated state. The first center electrode 21 is connected at one end thereof to a first input/output port P1 and connected at another end thereof to ground. The second center electrode 22 is connected at one end thereof to a second input/output port P2 and connected at another end thereof to the ground.

Capacitance elements C1 and C2 are connected in parallel with the first center electrode 21 and the second center electrode 22, respectively, to form a first LC parallel resonant circuit and a second LC parallel resonant circuit, respectively. A resistance element R is connected in series between the first input/output port P1 and the second input/output port P2, and a phase-shift circuit (an LC parallel resonant circuit composed of an inductance element L5 and a capacitance element C5) is connected in series with the resistance element R. Furthermore, a capacitance element Cs1 for input impedance matching is connected between the first input/output port P1 and an input terminal IN. A capacitance element Cs2 for output impedance matching is connected between the second input/output port P2 and an output terminal OUT.

In the two-port-type isolator 1 having the above circuit configuration, when a high-frequency signal is inputted from the input terminal IN to the port P1 (a forward direction), the ports P1 and P2 are in-phase, and no current flows through the resistance element R, so that the high-frequency signal is transmitted to the output terminal OUT in a state where insertion loss is low. The high-frequency signal also does not flow through the LC parallel resonant circuit composed of the inductance element L5 and the capacitance element C5, so that the insertion loss does not increase.

Meanwhile, when a high-frequency signal is inputted from the output terminal OUT to the port P2 (a reverse direction), a phase difference occurs between the high-frequency signals at the ports P1 and P2, and a current flows through the resistance element R, so that the high-frequency current is greatly attenuated (isolated). However, the high-frequency current is not entirely consumed by the resistance element R, and a part thereof is transmitted to the port P1. At the time of transmission in the reverse direction, a route of flow through the center electrodes 21 and 22 is referred to as transmission route (1), and a route of flow through the resistance element R is referred to as transmission route (2). In this case, when the phase difference between the high-frequency signals flowing in the transmission route (1) and in the transmission route (2), respectively, is closer to 180 degrees, the degree to which the currents are cancelled to each other increases, and the isolation characteristics become favorable.

Figure 4:
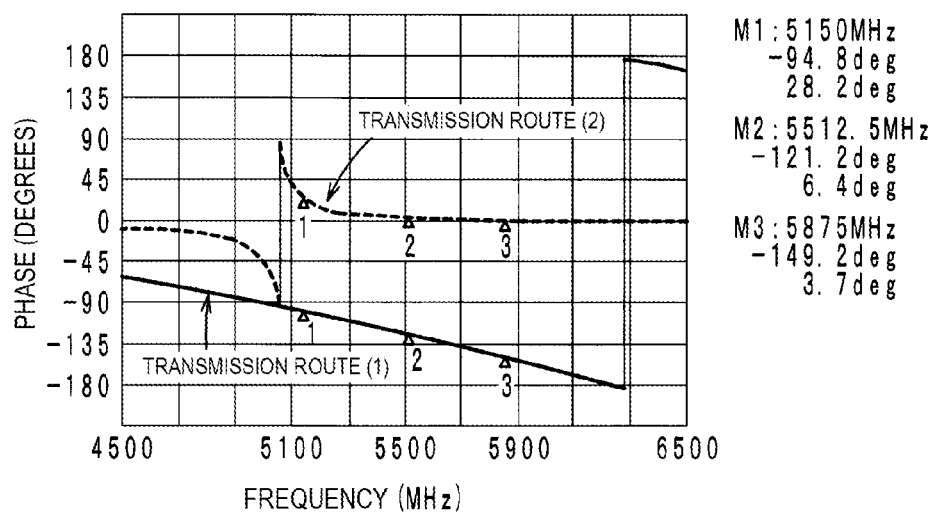
FIG. 4 is a graph showing the phase characteristics of the non-reciprocal circuit element.
Figure 11:
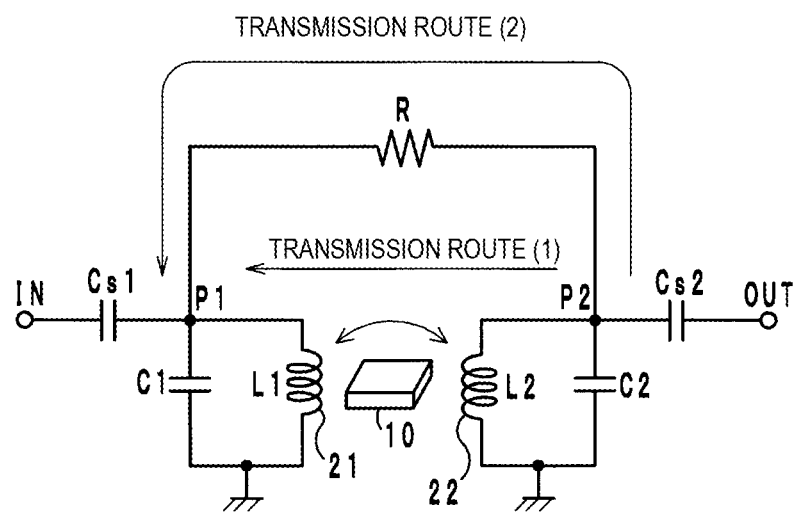
FIG. 11 is an equivalent circuit diagram of an existing non-reciprocal circuit element.
Figure 12:
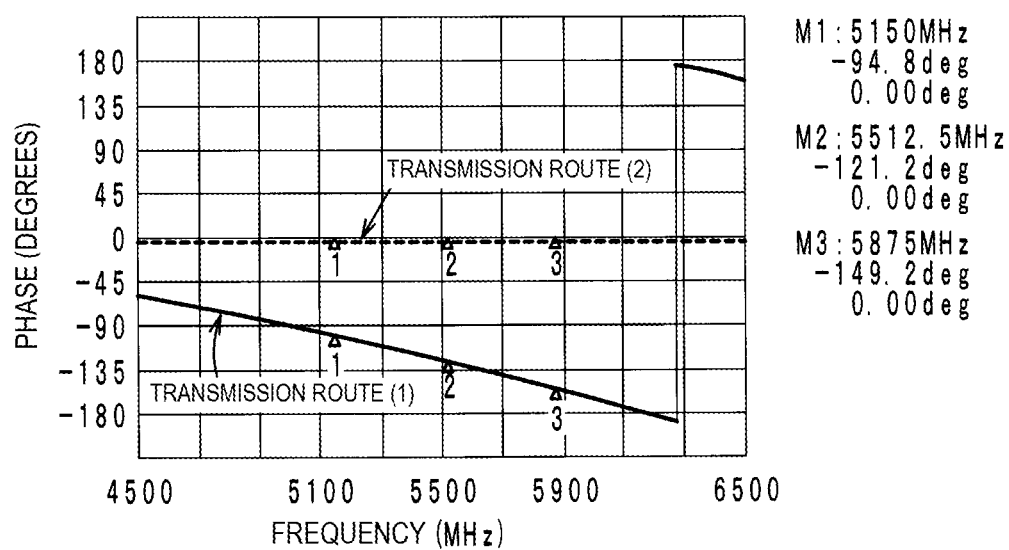
FIG. 12 is a graph showing the phase characteristics of the non-reciprocal circuit element shown in FIG. 11.

FIG. 4 shows the phase difference characteristics in the reverse direction in the first embodiment. For comparison, FIG. 12 shows the phase difference characteristics in the reverse direction in the related art example shown in FIG. 11. When the frequency is each of 5150 MHz, 5512.5 MHz, and 5875 MHz, a greater phase difference occurs in the first embodiment shown in FIG. 4 than in the related art example shown in FIG. 12. Tables 1A and 1B below show the phase difference at each frequency. In addition, Tables 1C and 1D below show the phase difference at each frequency in the forward direction.

Figure 5:
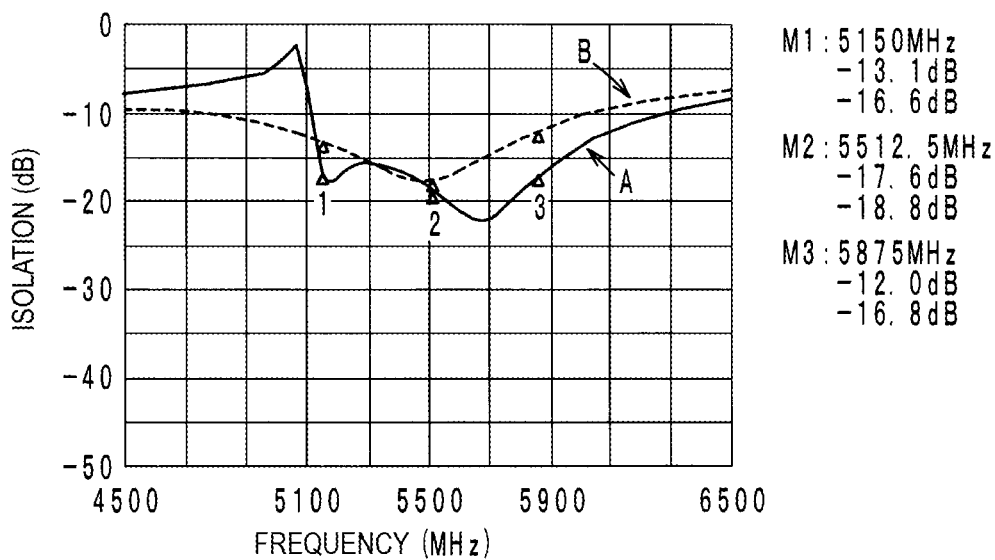
FIG. 5 is a graph showing the isolation characteristics of the non-reciprocal circuit element.

In the first embodiment, specific isolation characteristics are as shown by a curved line A in FIG. 5. On the other hand, the isolation characteristics of the related art example shown in FIG. 11 are as shown by a curved line B in FIG. 5. As is obvious from the comparison of both examples, in the first embodiment, the frequency band where the isolation characteristics are equal to or less than 15 dB is wider than that in the related art example, and the isolation characteristics are improved over a wide band. Table 1E below shows the attenuation of the isolation characteristics at each frequency.

[Table 1]

TABLE 1A

| First embodiment | Reverse direction | | |
|---|---|---|---|
| (with C3/L3) Phase | Transmission route (1) | Transmission route (2) | \|Phase difference\| (degrees) |
| 5150 MHz | −94.8 | 28.2 | 123.0 |
| 5512.5 MHz | −121.2 | 6.4 | 127.6 |
| 5875 MHz | −149.2 | 3.7 | 152.9 |

TABLE 1B

| Related art example | Reverse direction | | |
|---|---|---|---|
| (without C3/L3) Phase | Transmission route (1) | Transmission route (2) | |Phase difference| (degrees) |
| 5150 MHz | −94.8 | 0.0 | 94.8 |
| 5512.5 MHz | −121.2 | 0.0 | 121.2 |
| 5875 MHz | −149.2 | 0.0 | 149.2 |

TABLE 1C

| First embodiment | Forward direction | | |
|---|---|---|---|
| (with C3/L3) Phase | Transmission route (1) | Transmission route (2) | |Phase difference| (degrees) |
| 5150 MHz | 31.1 | 28.2 | 3.0 |
| 5512.5 MHz | 4.2 | 6.4 | 2.2 |
| 5875 MHz | −23.2 | 3.7 | 26.8 |

TABLE 1D

| Related art example | Forward direction | | |
|---|---|---|---|
| (without C3/L3) Phase | Transmission route (1) | Transmission route (2) | |Phase difference| (degrees) |
| 5150 MHz | 31.1 | 0.0 | 31.1 |
| 5512.5 MHz | 4.2 | 0.0 | 4.2 |
| 5875 MHz | −23.2 | 0.0 | 23.2 |

TABLE 1E

| Isolation | Related art example (without C3/L3) | First embodiment (with C3/L3) | Amount of improvement (dB) |
|---|---|---|---|
| 5150 MHz | 13.1 | 16.6 | 3.5 |
| 5512.5 MHz | 17.6 | 18.8 | 1.2 |
| 5875 MHz | 12.0 | 16.8 | 4.8 |

Figure 6:
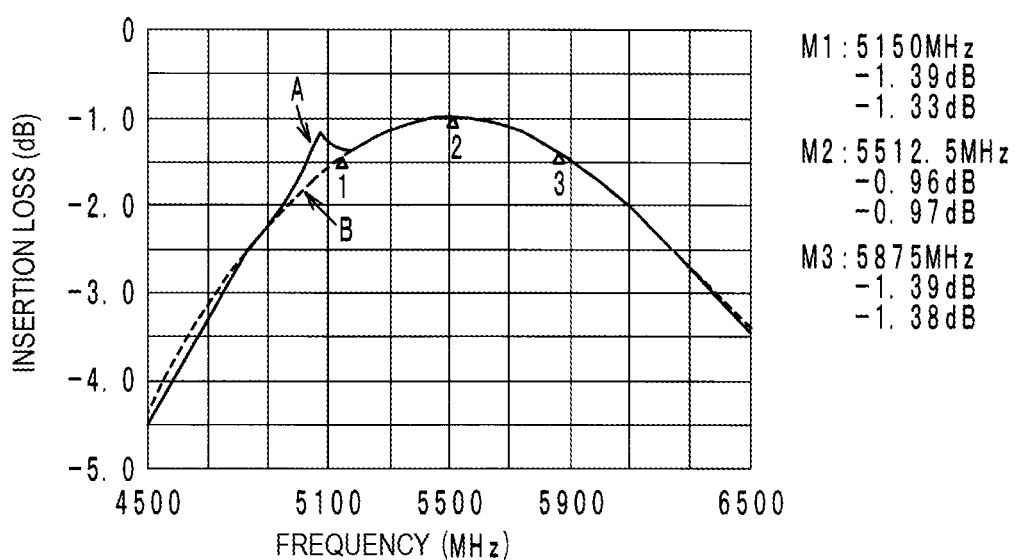
FIG. 6 is a graph showing the insertion loss characteristics of the non-reciprocal circuit element.

In the first embodiment, specific insertion loss characteristics are as shown by a curved line A in FIG. 6. On the other hand, the insertion loss characteristics of the related art example shown in FIG. 11 are as shown by a curved line B in FIG. 6. When both characteristics are compared to each other, the insertion loss near 5150 MHz is improved in the first embodiment. This is because the resonant frequency of the LC parallel resonant circuit composed of the inductance element L5 and the capacitance element C5 is set to approximately 5150 MHz, and thus the impedance at the transmission route (2) side at which the resistance element R is connected becomes infinite at this frequency, so that almost no high-frequency signal flows through the resistance element R.

In the non-reciprocal circuit element disclosed in Patent Document 2 described above, by connecting the LC series resonant circuit to the resistance element, the band in which the isolation characteristics are obtained is widened. Here, the band in which the isolation characteristics are obtained is widened by matching the resistance element over a wide range on the basis of the impedance characteristics of the LC series resonant circuit. On the other hand, in the non-reciprocal circuit element according to the first embodiment, by connecting the LC parallel resonant circuit, composed of the elements L5 and C5, in series with the resistance element R, the phase difference between the high-frequency signals in the transmission routes (1) and (2) is increased, so that the isolation characteristics are improved.

Figure 2:
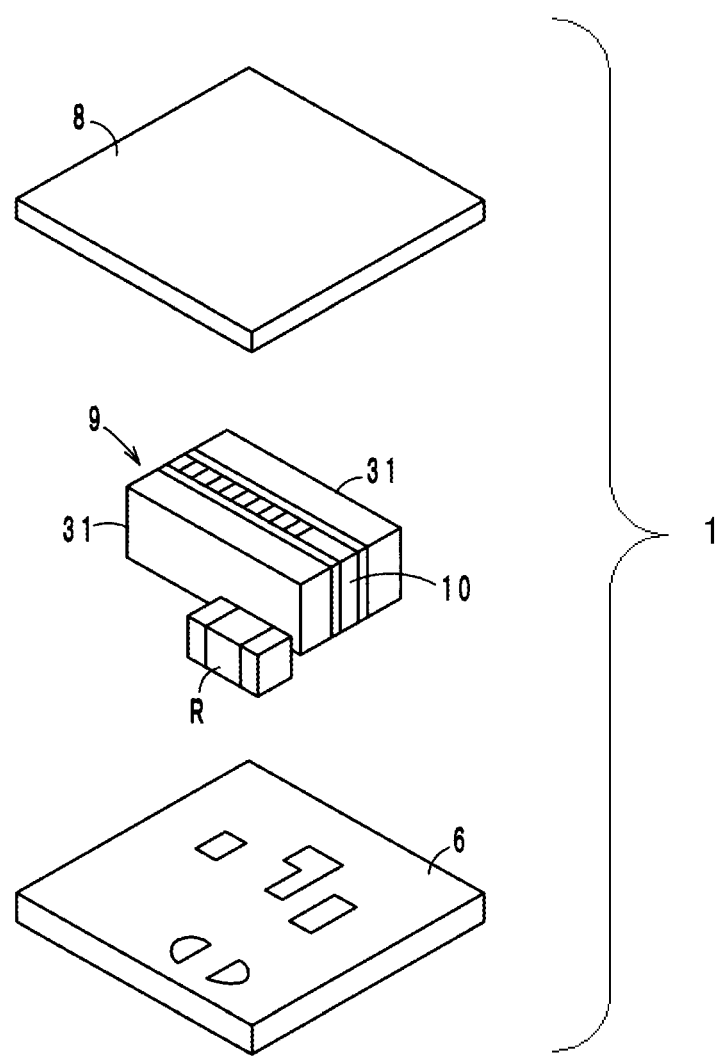
FIG. 2 is an exploded perspective view of the non-reciprocal circuit element.
Figure 3:
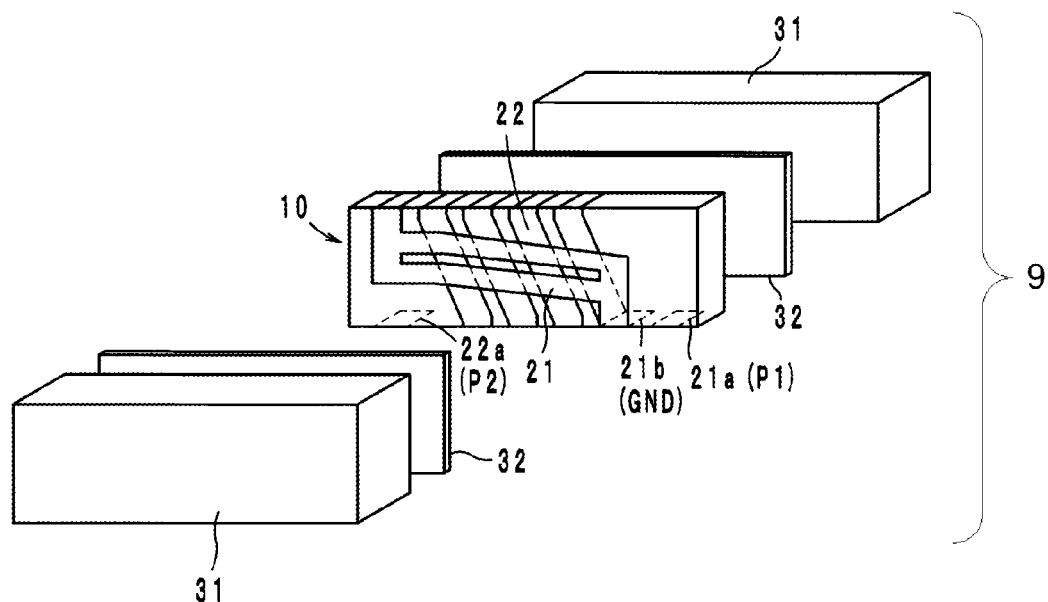
FIG. 3 is an exploded perspective view of a ferrite/magnet assembly shown in FIG. 2.

Here, the configuration of a main part of the two-port-type isolator 1 will be described with reference to FIGS. 2 and 3. The lumped two-port-type isolator 1 includes a ferrite/magnet assembly 9 in which the permanent magnet 31 is attached on each of the front and back surfaces of the ferrite 10 by means of an adhesive 32. The assembly 9 is mounted on a multilayer board 6 such that a principal surface of the ferrite 10 extends in the vertical direction. A yoke 8 is disposed directly above the assembly 9.

The first center electrode 21 is wound on the front and back surfaces of the ferrite 10 by one turn, one end electrode 21a thereof is the port P1, and another end electrode 21b thereof is a ground port. The second center electrode 22 is wound on the front and back surfaces of the ferrite 10 by four turns so as to intersect the first center electrode 21 at a predetermined angle with an insulated state maintained. The number of times of wounding is optional. One end electrode 22a of the second center electrode 22 is the port P2, and another end thereof is shared (ground port) with the electrode 21b. In FIG. 3, for avoiding complication, the electrodes at the back surface side of the ferrite 10 are not shown.

The circuit elements (the capacitance elements C1, C2, C5, Cs1, and Cs2, and the inductance element L5) are embedded in the multilayer board 6. By embedding at least any of these circuit elements in the multilayer board 6, it is possible to reduce the size of the isolator 1.

As the phase difference between the high-frequency signal inputted from the output terminal OUT and flowing in the transmission route (1) (the reverse direction) and the high-frequency signal flowing in the transmission route (2) is closer to 180 degrees, a more preferable effect is obtained. Thus, instead of the LC parallel resonant circuit, it is only necessary to provide a phase-shift circuit that has a function to cause the phase difference between the high-frequency signal flowing in the transmission route (1) (the reverse direction) and the high-frequency signal flowing in the transmission route (2) to be close to 180 degrees in a predetermined frequency band. As an example of such a phase-shift circuit, for example, a stripline type transmission line may be used.

Second Embodiment; See FIG. 7

Figure 7:
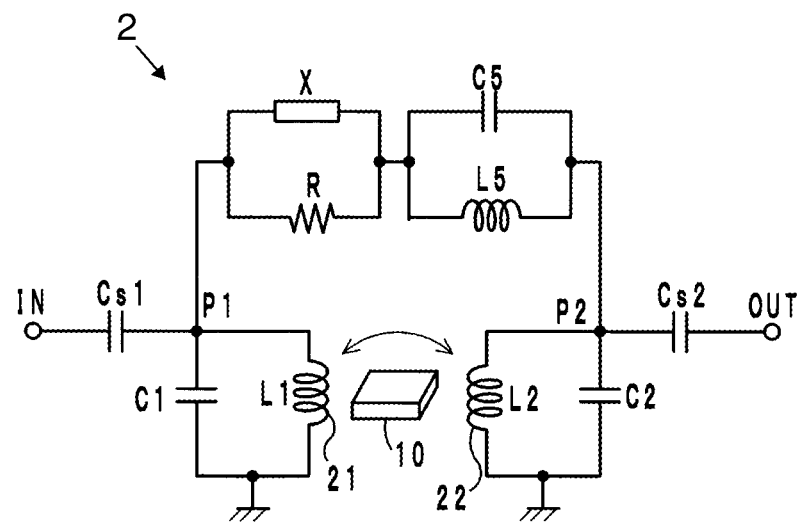
FIG. 7 is an equivalent circuit diagram of a non-reciprocal circuit element according to a second embodiment.

A non-reciprocal circuit element (two-port-type isolator 2) according to a second embodiment is one in which a reactance element X is connected in parallel with respect to the resistance element R as shown in FIG. 7, and the other configuration thereof is the same as the configuration of the isolator 1 according to the first embodiment described above. The advantageous effects of the second embodiment are basically the same as those of the first embodiment described above, and it is possible to adjust the center frequency of the isolation characteristics by providing the reactance element X. The center frequency of the isolation characteristics is adjusted to a desired frequency by optimizing the angle at which the center electrodes 21 and 22 intersect each other. However, the center frequency may be shifted from the desired frequency due to manufacturing variations of the center electrodes 21 and 22 and needs to be adjusted.

When a capacitance element is used as the reactance element X, the center frequency of the isolation characteristics decreases; and when an inductance element is used as the reactance element X, the center frequency increases.

Such a capacitance element or inductance element may be mounted as a chip type on the multilayer board, or may be formed as an internal electrode and embedded in the multilayer board.

In the case where the non-reciprocal circuit element is produced in quantity, stable isolation characteristics are obtained by selecting a chip type capacitance element or inductance element having an optimum element value for each manufacturing lot of the center electrodes 21 and 22. In addition, in the case where the capacitance element or inductance element is embedded in the multilayer board, it is possible to adjust the capacitance value or inductance value by cutting an internal electrode pattern by means of a laser, a router, or the like.

Third Embodiment; See FIG. 8

Figure 8:
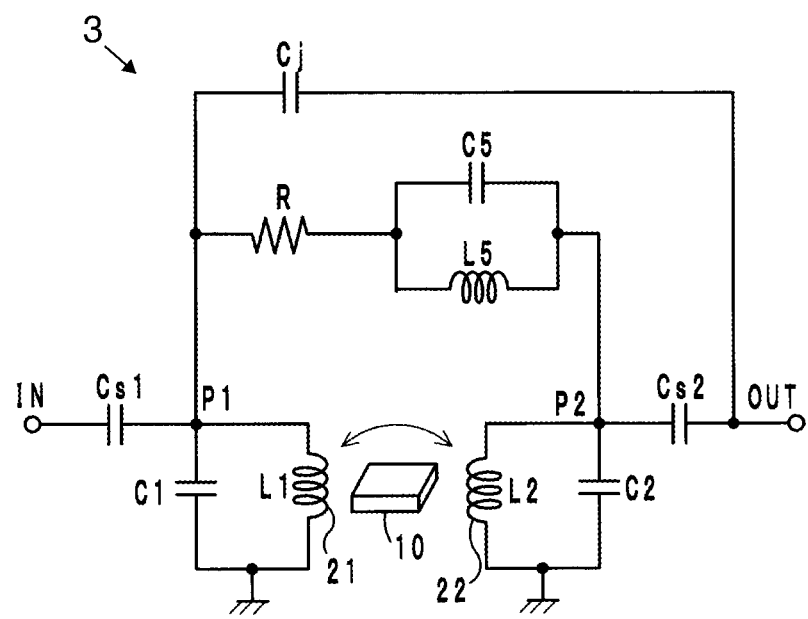
FIG. 8 is an equivalent circuit diagram of a non-reciprocal circuit element according to a third embodiment.

A non-reciprocal circuit element (two-port-type isolator 3) according to a third embodiment is one in which a capacitance element Cj is further connected in series between the first port P1 and the output terminal OUT as shown in FIG. 8, and the other configuration thereof is the same as that of the isolator 1 according to the first embodiment described above. The advantageous effects of the third embodiment are basically the same as those of the first embodiment described above. In particular, the capacitance element Cj is for impedance matching between the ports P1 and P2, and it is possible to finely adjust the attenuations of the isolation characteristics and the insertion loss characteristics by changing the capacitance value of the capacitance element Cj. Thus, by providing the capacitance element Cj, it is possible to easily obtain the desired characteristics.

Fourth Embodiment; See FIG. 9

Figure 9:
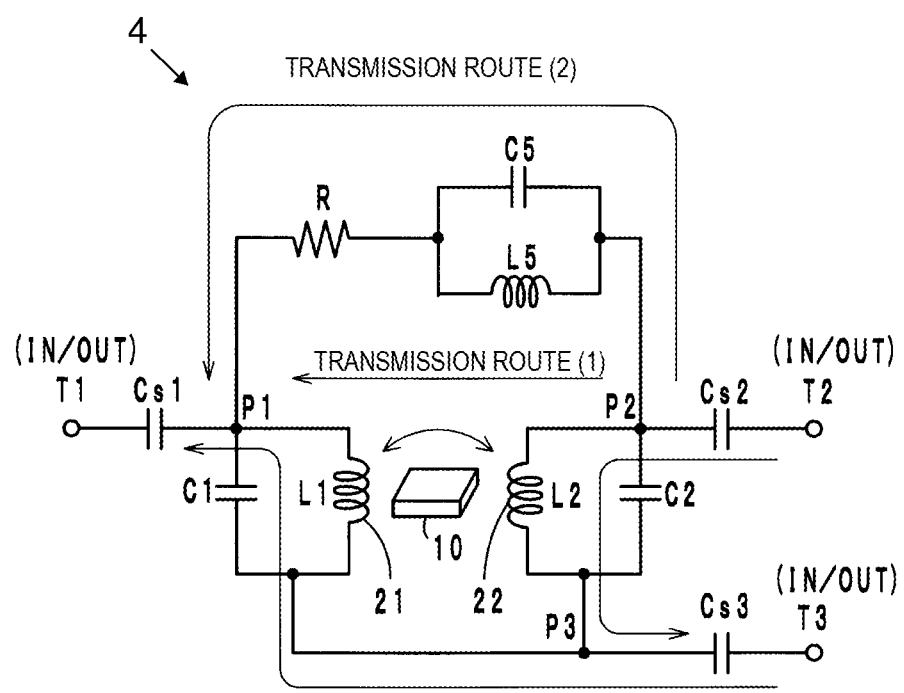
FIG. 9 is an equivalent circuit diagram of a non-reciprocal circuit element according to a fourth embodiment.

A non-reciprocal circuit element (three-port-type circulator 4) according to a fourth embodiment is one in which the other end of the first center electrode 21 and the other end of the second center electrode 22 are a third input/output port P3, and the port P3 is connected to an input/output terminal T3 via a capacitance element Cs3 for impedance matching, as shown in FIG. 9. In addition, an input/output portion of the one end (input/output port P1) of the first center electrode 21 is a terminal T1, and an input/output portion of the one end (input/output port P2) of the second center electrode 22 is a terminal T2. The other configuration is basically the same as that of the isolator 1 according to the first embodiment described above.

In the three-port-type circulator 4, a high-frequency signal inputted to the terminal T1 is transmitted to the terminal T2. A high-frequency signal inputted to the terminal T2 is mainly transmitted to the terminal T3 on the basis of the resonant frequency of the elements L2 and C2, and a signal component transmitted from the terminal T2 to the terminal T1 is attenuated by the resistance element R. Furthermore, the phase difference between the LC parallel resonant circuit transmission route 1 and transmission route 2 is adjusted to 180 degrees by the elements L5 and C5 as described in the first embodiment, so that the isolation characteristics become favorable. A high-frequency signal inputted to the terminal T3 is transmitted to the terminal T1 on the basis of the resonant frequency of the elements L1 and C1, and is not transmitted to the terminal T2.

Fifth Embodiment; See FIG. 10

Figure 10:
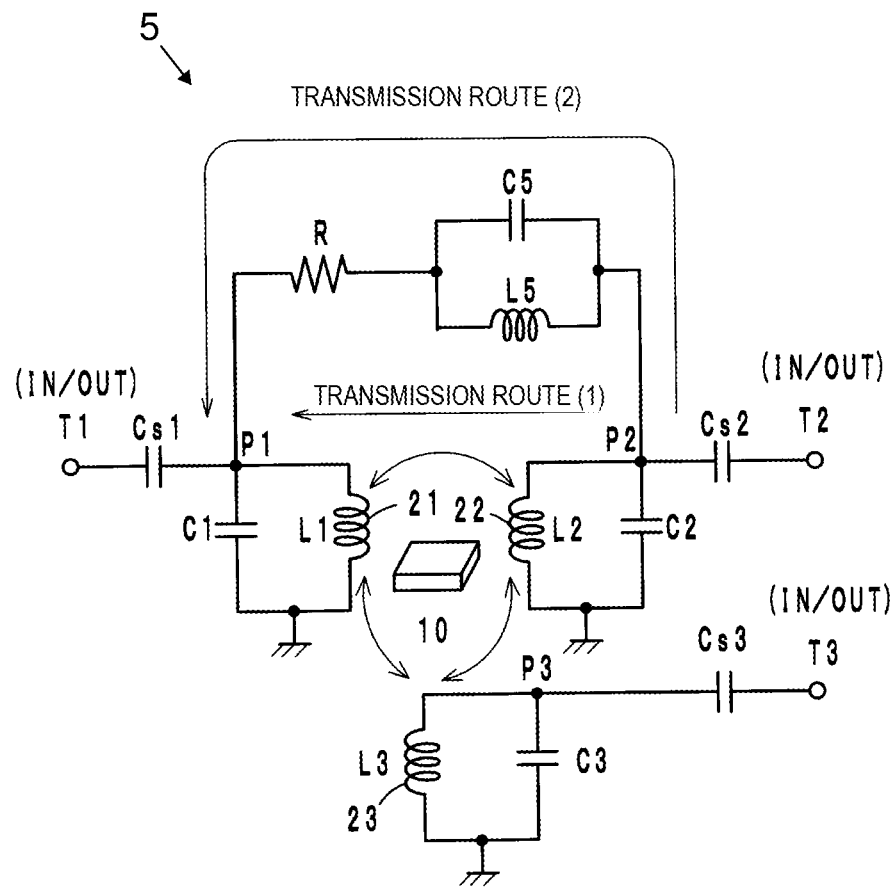
FIG. 10 is an equivalent circuit diagram of a non-reciprocal circuit element according to a fifth embodiment.

A non-reciprocal circuit element (three-port-type circulator 5) according to a fifth embodiment is one in which, in addition to the first center electrode 21 and the second center electrode 22, a third center electrode 23 is disposed on the ferrite 10 so as to intersect the center electrodes 21 and 22 in an insulated state as shown in FIG. 10. One end of the third center electrode 23 corresponds to the third input/output port P3, and the port P3 is connected to the terminal T3 via the capacitance element Cs3 for impedance matching. The other end of the third center electrode 23 is connected to the ground. Furthermore, a capacitance element C3 is connected in parallel with the third center electrode 23 to form a third parallel resonant circuit. In addition, an input/output portion of the one end (input/output port P1) of the first center electrode 21 is a terminal T1, and an input/output portion of the one end (input/output port P2) of the second center electrode 22 is a terminal T2. The other configuration is basically the same as that of the isolator 1 according to the first embodiment described above.

In the three-port-type circulator 5, a high-frequency signal inputted to the terminal T1 is transmitted to the terminal T2. A high-frequency signal inputted to the terminal T2 is transmitted to the terminal T3 on the basis of the resonant frequency of the elements L2 and C2 and the resonant frequency of the elements L3 and C3, and a signal component leaking to the terminal T1 is attenuated by the resistance element R. Furthermore, the phase difference between the LC parallel resonant circuit transmission route 1 and transmission route 2 is adjusted to 180 degrees by the elements L5 and C5 as described in the first embodiment, so that the isolation characteristics between the terminal T1 and the terminal T2 become favorable. A high-frequency signal inputted to the terminal T3 is transmitted to the terminal T1 on the basis of the resonant frequency of the elements L1 and C1 and the resonant frequency of the elements L3 and C3, and is not transmitted to the terminal T2 because of the non-reciprocity of the ferrite.

In the present embodiment, a circuit composed of a resistor R and elements L5 and C5 provided between the input/output ports P1 and P2 may be provided between the input/output ports P2 and P3 or between the input/output ports P3 and P1. With this configuration, it is possible to properly adjust the element values of the elements L5 and C5 between the respective ports to make the isolation characteristics between the respective ports favorable.

Other Embodiments

The non-reciprocal circuit element according to the present disclosure is not limited to the embodiments described above, and can be modified in a variety of ways within the scope of the present disclosure.

For example, when the N pole and the S pole of the permanent magnet 31 are inverted, the input/output relationships of the ports P1 and P2 are interchanged. In addition, the configuration of the ferrite/magnet assembly 9, particularly, the shapes of the first and the second center electrodes 21 and 22, etc. is optional.

As described above, the present disclosure is useful for non-reciprocal circuit elements, and is particularly excellent in being able to obtain isolation characteristics over a wide band.

1, 2, 3 two-port-type isolator
4, 5 three-port-type circulator
6 multilayer board
10 ferrite
21, 22, 23 center electrode
31 permanent magnet
P1, P2, P3 port C1, C2, C3, C5, Cj capacitance element
L5 inductance element
R resistance element
X reactance element

The invention claimed is:

1. A non-reciprocal circuit element comprising:
a magnetic material to which a DC magnetic field is applied by a permanent magnet; and
a plurality of center electrodes disposed on the magnetic material so as to intersect each other in an insulated state and comprising a first center electrode and a second center electrode, wherein
one end of the first center electrode is connected to a first input/output port, and one end of the second center electrode is connected to a second input/output port, and
a resistance element is connected in series between the first input/output port and the second input/output port, and a phase-shift circuit is connected in series with the resistance element, wherein the phase-shift circuit is an LC parallel resonant circuit composed of an inductance element and a capacitance element.

2. The non-reciprocal circuit element according to claim 1, wherein an additional capacitance element is connected in series between the first input/output port and the second input/output port.

3. The non-reciprocal circuit element according to claim 1, wherein a reactance element is connected in parallel with respect to the resistance element.

4. The non-reciprocal circuit element according to claim 1, wherein a reactance element is connected in parallel with respect to the resistance element.

5. The non-reciprocal circuit element according to claim 4, wherein an additional capacitance element is connected in series between the first input/output port and the second input/output port.

6. The non-reciprocal circuit element according to claim 1, wherein another end of the first center electrode and another end of the second center electrode are connected to a third input/output port.

7. The non-reciprocal circuit element according to claim 6, wherein a reactance element is connected in parallel with respect to the resistance element.

8. The non-reciprocal circuit element according to claim 6, wherein an additional capacitance element is connected in series between the first input/output port and the second input/output port.

* * * * *